(12) United States Patent
Nakadai

(10) Patent No.: US 7,616,298 B2
(45) Date of Patent: Nov. 10, 2009

(54) DISK TRANSFER MECHANISM, AND DISK INSPECTION APPARATUS AND DISK INSPECTION METHOD USING THE SAME

(75) Inventor: Tsutomu Nakadai, Kanagawa (JP)

(73) Assignee: Hitachi High-Technologies Corporation, Tokyo (JP)

( * ) Notice: Subject to any disclaimer, the term of this patent is extended or adjusted under 35 U.S.C. 154(b) by 607 days.

(21) Appl. No.: 11/513,373

(22) Filed: Aug. 31, 2006

(65) Prior Publication Data
US 2008/0056711 A1 Mar. 6, 2008

(51) Int. Cl.
G01N 21/00 (2006.01)

(52) U.S. Cl. .................. 356/237.1; 360/31; 369/58

(58) Field of Classification Search ... 356/237.1–237.5, 356/399–401; 369/58, 44.32, 54; 29/563; 414/941, 753.1, 751.1, 806
See application file for complete search history.

(56) References Cited

U.S. PATENT DOCUMENTS 5,423,111 A * 6/1995 Mori ...................... 29/90.01
5,909,117 A * 6/1999 Nakadai et al. ............ 324/212
5,999,366 A * 12/1999 Shiraishi et al. .......... 360/99.09
6,122,238 A * 9/2000 Langenskiold ........... 369/53.15
7,489,394 B2 * 2/2009 Wienecke et al. ........ 356/237.2
2008/0100286 A1 * 5/2008 Meder et al. ............... 324/212

FOREIGN PATENT DOCUMENTS

JP 10-143861 5/1998

* cited by examiner

Primary Examiner—Hoa Q Pham
(74) Attorney, Agent, or Firm—Mittingly & Malur, P.C.

(57) ABSTRACT

The present invention is provided with a first and second spindle at respective initial positions spaced apart by a predetermined distance and disposed linearly at both sides of inspection positions where the spindles are set for disk inspection, a disk inverting mechanism is provided at either the front side or the back side of the inspection position, at the same time when a disk fitted to the first spindle is transferred to the inspection position, a disk fitted to the second spindle is returned from the inspection position to own initial position, and at the same time when a disk fitted to the second spindle is transferred to the inspection position, a disk fitted to the first spindle is returned from the inspection position to own initial position, and the disk fitted to the first spindle which is returned to the own initial position is delivered to the disk inverting mechanism, thereby an inverted disk is fitted to the second spindle.

19 Claims, 7 Drawing Sheets

DISK TRANSFER MECHANISM, AND DISK INSPECTION APPARATUS AND DISK INSPECTION METHOD USING THE SAME

FIELD OF THE INVENTION

The present invention relates to a disk transfer mechanism, and disk inspection apparatus and disk inspection method using the same, and more specifically, relates to a disk inspection apparatus, which enhances inspection efficiency for the front and back faces of a small sized magnetic disk and is permitted to reduce the size thereof.

BACKGROUND ART

A magnetic disk (herein after will be called simply as a disk) used for recording information is inspected by an inspection apparatus with regard to such as defects of the surface and whether the performance of the recording medium is good or bad. Such inspection apparatus takes out successively a disk from a cassette, which accommodates a plurality of disks not yet inspected and representing inspection objects, fits the taken out disk to a spindle of the inspection apparatus and rotates the same. Then, for the first time, the front face side of the disk is inspected, after completing the inspection, the disk is inverted and the back face side thereof is inspected and the disk completed the inspection is accommodated into another cassette used for already inspected disks. In order to transfer a disk between both cassettes for not yet inspected disks and for already inspected disks and the spindle and to invert the same efficiently, the inspection apparatuses of this sort are provided with a variety of transfer devices using a robot mechanism. Among these, U.S. Pat. No. 5,909,117 (which corresponds to JPH10-143861A) discloses a disk inspection apparatus in which a plurality of spindles are disposed on a turn table, an inspection stage and a disk inverting mechanism are arranged around the turn table, the turn table is rotated by a predetermined angle and disks are inverted thereby, the front and back faces of the disks are successively inspected.

An application of a hard disk device (HDD) spreads now a days such as to automotive products, home appliance products and audio products, hard disk drive devices for from 2.5 inches to 1.8 inches, moreover for below 1.0 inch are built-in in a variety of devices and used therefor. The size of the hard disk drive devices tends to be further reduced, moreover, a unit cost of the hard disk drive device itself decreases and manufacturers are required to manufacture a great quantity of hard disk drive devices while reducing the cost.

For this reason the disk inspection apparatus is also demanded to inspect a great quantity of disks efficiently and to reduce the size thereof. However, although the conventional disk inspection apparatuses including one disclosed in U.S. Pat. No. 5,909,117 as referred to above can process successively many number of small sized disks below 2.5 inches, because of the use of the turn table, a variety of devices such as the inspection stage and sthe disk inverting mechanism have to be arranged around the disk turn table, therefore, a problem remains that in comparison with the size reduction of the disks representing the inspection objects, the size reduction of the inspection apparatus is insufficient.

SUMMARY OF THE INVENTION

An object of the present invention is to resolve such conventional problems and to provide a disk transfer mechanism, which enhances inspection efficiency for the front and back faces of a disk and is permitted to reduce the size of a disk inspection apparatus.

Another object of the present invention is to provide a disk inspection apparatus, which enhances inspection efficiency for the front and back faces of a disk and is permitted to reduce the size thereof.

Still another object of the present invention is to provide a disk inspection method, which enhances inspection efficiency for the front and back faces of a disk.

A disk transfer mechanism or a disk inspection apparatus utilizing the same which achieves these objects is provided with a first spindle and a second spindle which are set at first initial position and at a second initial position respectively which are on a straight alignment line on which the first initial position, inspection positions for disk inspection at which the spindles are set and the second initial position are aligned, and which are positioned alternatively at the respective inspection positions, a spindle moving mechanism which moves the first spindle and the second spindle respectively along the alignment line toward the respective inspection positions and a control unit through control of the spindle moving mechanism which moves the first spindle to the inspection position, after completing an inspection of a disk fitted to the first spindle, moves the first spindle from the own inspection position to the first initial position as well as moves the second spindle to the own inspection position, and after completing an inspection of a disk fitted to the second spindle, moves the second spindle from the own inspection position to the second initial position as well as moves the first spindle to the own inspection position, wherein the disk fitted to the second spindle is the one which is detached from the first spindle after completing the inspection and inverted by the disk inverting mechanism.

In the disk transfer mechanism or the disk inspection apparatus of the present invention, the inspection positions and the two spindles which are on either side of the inspection positions with a predetermined distance are aligned on a straight line, the spindles aligned at the both sides can be positioned alternatively to the respective inspection positions through linear movement along the alignment line in a short time. Moreover, the disk fitted to the second spindle is the inverted disk of the disk having been fitted to the first spindle. Thereby, the efficiency of front and back faces inspection of disks can be enhanced. Further, the disk inverting mechanism can be disposed at a front or back position on a line perpendicular to the alignment line.

Accordingly, the length (the length of the above alignment line) for the disk inspection apparatus seen from a plane where small size disks are inspected will be sufficient when the length of two sheets of disks+α (α is an allowance component) relating to an interval between the two spindles and the length of one sheet of disk for the disk inspection. Further, when disposing the disk inverting mechanism at the front side or the back side with respect to the alignment line, the length of the disk inspection apparatus in the back and forth direction including the alignment line is determined roughly by adding at the front side or the back side of an inspection stage the length corresponding to one sheet of the disk to the length of the inspection stage for the space of disk inversion. Further, when the inspection stage is an optical system of surface defect inspection, since the inspection stage can be provided above the inspection positions, a length increase of the disk inspection apparatus in the back and forth direction is almost prevented.

As a result, the length of the disk transfer mechanism or the disk inspection apparatus can be shortened in total to a distance nearly to a distance corresponding to three sheets of disks+the allowance for the handling. Further, the length in the back and forth direction of the disk inspection apparatus likely requires a distance corresponding to three sheets of disks+the allowance for the handling which is determined by totaling a width corresponding to one sheet of disk for supplying and discharging disks, a width corresponding to one sheet of disk for loading a disk for inspection and in addition a width corresponding to one sheet of disk for inverting a disk and thereby, the depth of the disk inspection apparatus can be shortened. Thus a small sized disk transfer mechanism or disk inspection apparatus can be realized.

Further, when disposing the disk inverting mechanism at the front side or the back side with respect to the alignment line, the disk handling can be performed substantially on the same plane as that for the disk inspection positions in the present inspection apparatus. Thereby, the disk handling time is shortened and the height of the disk transfer mechanism or the disk inspection apparatus can be lowered.

In addition, the number of the spindles can be limited to two in the present disk inspection apparatus and during a disk inspection when an already inspected disk is inverted and is transferred from the position at the first spindle side to the position at the second spindle side, the front and back faces inspection of disks can be performed continuously. In particular, when the inspection stage is the optical system of surface defect inspection, the efficiency of front and back faces inspection of disks can be enhanced.

As a result, the inspection of small sized disks can be performed efficiently, and a small sized disk transfer mechanism and a small sized disk inspection apparatus utilizing the same can be easily realized.

DESCRIPTION OF THE PREFERRED EMBODIMENT

Figure 1:
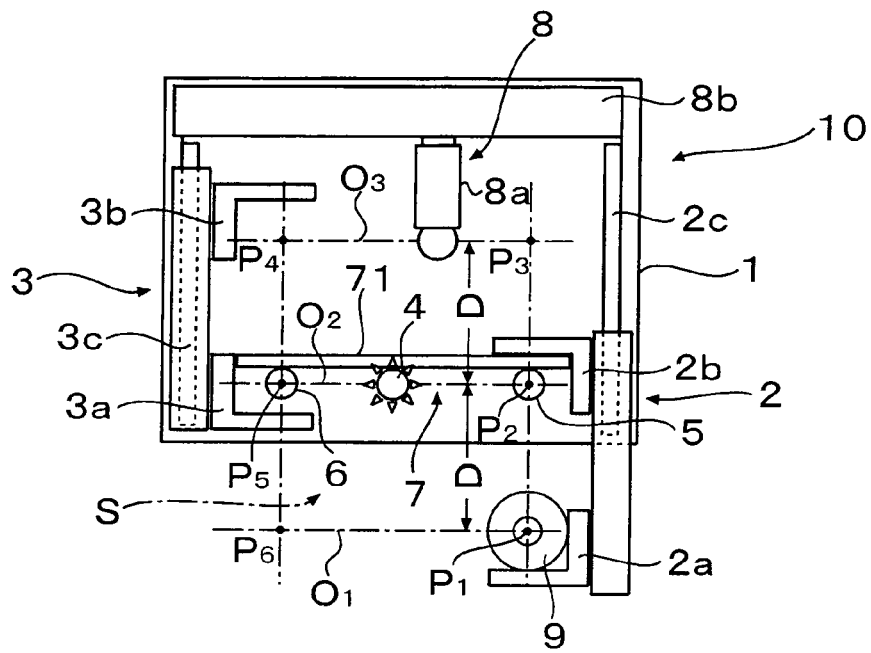
FIG. 1 is a plane view of an embodiment of a transfer mechanism to which the present invention is applied.

In FIG. 1, 10 is a disk transfer mechanism, wherein 1 is a base thereof, and a loader handling robot 2 and a unloader handling robot 3 are provided on the base 1 at both sides thereof. These handling robots respectively move back and forth independently or at the same time. The front and back relation of the present inspection apparatus is determined with reference to an optical system of surface defect inspection 4 and the front side is the lower side in FIG. 1 and the back side is the upper side in FIG. 1.

The loader handling robot 2 carries disk changers (handling arms) 2a and 2b being spaced with a between center distance D at back and forth positions in a symmetric manner with respect to the center thereof.

The unloader handling robot 3 carries disk changers (handling arms) 3a and 3b being spaced with a between center distance D at back and forth positions in a symmetric manner with respect to the center thereof. These loader handling robot 2 and unloader handling robot 3 move in back and forth by the distance D. At the positions shown in FIG. 1, the loader handling robot 2 is at an advance position (front side) and the unloader handling robot 3 is at a retreat position (back side).

2c and 3c are respectively guide rails for guiding the back and forth movement of the loader handling robot 2 and unloader handling robot 3, and respective movement drive mechanisms are built-in in the guide rails.

Although not illustrated in the drawing, the disk changers 2a, 2b, 3a and 3b are respectively provided with an outer circumferential chuck, which chucks a disk from the outer circumference at three points. Since such outer circumferential chuck mechanism for a disk is well known, the illustration thereof is omitted.

Further, the spindles 5 and 6 are respectively provided with an inner circumferential chuck mechanism, which chucks a center opening of a disk 9 from the top thereof. Since such inner circumferential chuck mechanism for a disk is also well known, the illustration thereof is omitted. Handling robots at cassettes side, which perform delivery of disks between the disk changers 2a and 3a and the cassettes accommodating disks of inspection object or disks already inspected, chuck the disks 9 at their inner circumference like the spindles 5 and 6. The inner circumferential chuck mechanism is one that chucks by pushing at two or three points or the entire face of the inner circumference or the entire inner circumferential side face like the spindles 5 and 6. Since the like handling robots which charge and discharge disks to and from the chucks and the cassettes are, for example, disclosed in JP2004-165331A and are well known, the illustration thereof is omitted. Further, the chuck mechanism of pushing the entire inner circumferential side face is disclosed in U.S. Pat. No. 5,781,375 assigned to the present assignee. A disk chuck mechanism, which chucks a disk at the inner circumference as well as at the outer circumference, is disclosed in U.S. Pat. No. 5,999,366 assigned to the present assignee.

Between the disk changers 2a and 3a, the optical system of surface inspection 4 is provided somewhat left side from the center, and the system is provided at a position, which permits to be arranged above the disks 9 fitted to the spindles. The spindles 5 and 6 are provided at both sides of the surface inspection optical system 4 so as to permit linear movement. These spindles 5 and 6 are arranged in straight at both sides of the surface inspection optical system 4 and are permitted to move along a movement guide plate 71 with a linear movement mechanism 7.

The spindles 5 and 6 move on the straight line along a movement guide plate 71 with a linear movement mechanism 7, and thereby, position the front face or the back face of a disk 9 at the inspection area of the surface inspection optical system 4. Positions on a straight line shown by a dashed line O2 to which the spindles 5 and 6 are positioned by the linear movement mechanism 7 so as to position the disks in the manner above are called as inspection positions of the spindles. Wherein, these inspection positions and initial positions P2 and P5 (which will explained later) of the spindles 5 and 6 in FIG. 1 are arranged linearly.

Herein, the spindle 5 serves as a spindle for inspecting defects at the front face side of a disk 9, and the spindle 6 serves as a spindle for inspecting defects at the back face side of the disk 9.

At the back side of the loader handling robot 2 and the unloader handling robot 3 a disk inverting mechanism 8 is provided on the base 1. The disk inverting mechanism 8 is constituted by a disk inverting chuck mechanism 8a and a linear movement mechanism 8b.

Chuck positions of the disk inverting mechanism 8 position on a line connecting a position P3 where the disk changer 2b delivers a disk to the disk inverting mechanism 8 and a position P4 where the disk changer 3b receives a disk from the disk inverting mechanism 8, when the loader handling robot 2 and the unloader handling robot 3 are respectively retreated (see FIG. 5 (a)). The disk inverting mechanism 8 reciprocates on the line 03 between point P3 as a starting position and point P4 as a finishing position.

Through downward movement of the loader handling robot 2 and the unloader handling robot 3 by a predetermined amount, the height of the chuck face of the disk changer 2b and the chuck face of the disk changer 3b coincides with that of the chuck face of the disk inverting mechanism 8. Since the disk changer 2b and the disk changer 3b chuck a disk outer circumferentially and contrary the disk inverting mechanism 8 chucks the disk inner circumferentially, the delivery and receiving of a disk 9 can be performed substantially on a same plane (a transfer face S of a disk, which will be explained later).

This relationship is the same of the disk changer 2a and the disk changer 3a which chuck a disk at the outer circumference thereof, with respect to the spindles 5 and 6 which chuck a disk at the inner circumference thereof as well as the handling robots at the cassette side which chuck a disk at the inner circumference thereof.

The predetermined amount of the downward movement of the loader handling robot 2 and the unloader handling robot 3 corresponds to the difference between the disk transfer face S and a face when the loader handling robot 2 and the unloader handling robot 3 move in back and forth direction. When the loader handling robot 2 and the unloader handling robot 3 complete delivery or receiving of a disk with the disk inverting mechanism 8, the loader handling robot 2 and the unloader handling robot 3 rise by the predetermined amount and then advance. This relationship is also applied to the relationship between the loader handling robot 2 and the unloader handling robot 3 and the spindles 5 and 6 which transfer a disk along the dashed line O2.

Wherein, the disk inverting mechanism 8 moves on the disk transfer face S along the line 03 connecting the centers of chuck positions, inverts a disk 9 on this plane and transfers the same through and on the plane.

Further, in FIG. 1, a dashed line 01 connecting centers of chuck positions is a line connecting centers of a load position and a unload position when the handling robots load or unload disks from the cassette, and a dashed line O2 connecting centers is a line connecting centers of chuck positions of the spindles 5 and 6.

The crossing points P1, P2, P3, P4, P5 and P6 determined by dashed lines connecting the respective center points with respect to the lines O1, O2 and O3 connecting these centers are points where the spindles 5 and 6, the disk changers 2a and 2b, the disk changer 3a and 3b and the disk inverting chuck mechanism 8a deliver disks 9 by means of the inner circumferential chucks and outer circumferential chucks. These crossing points P1, P2, P3, P4, P5 and P6 are on the disk transfer face S.

The crossing point P1 is a position where the handling robot of the cassette side which transfers disks from the cassette, supplies a disk to the disk changer 2a and wherein the disk changer 2a receives a disk 9 of inspection object taken out from the loader cassette through outer circumferential chuck from the cassette side handling robot with the inner circumferential chuck. Contrary, the crossing point P6 is a position where disks are delivered to the handling robot at the cassette side for accommodating the disks to be discharged to the unloader cassette and wherein the disk changer 3a delivers a disk 9 chucked outer circumferentially to the cassette side handling robot with the inner circumferential chuck.

Figure 2:
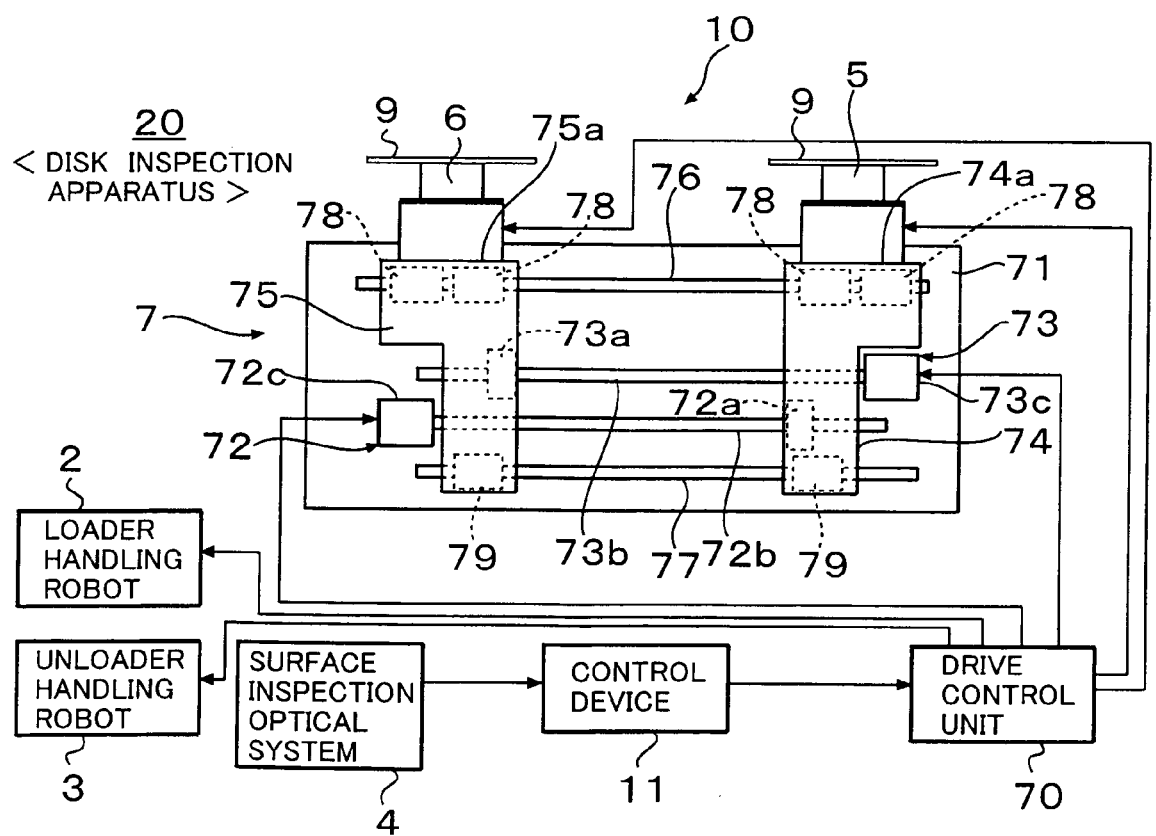
FIG. 2 is a view for explaining a constitution of a disk inspection apparatus and a linear movement mechanism for linearly moving spindles.

In FIG. 2, 20 is a disk inspection apparatus and is constituted by such as a disk transfer mechanism 10, a control device 11 and a drive control unit 70.

As shown in FIG. 2, the linear movement mechanism 7 is constituted by ball screw mechanisms 72 and 73 secured to the movement guide plate 71, moving plates 74 and 75 and guide rails 75 and 77. The guide rails 76 and 77 are respectively provided so as to correspond to the vertical end portions of the moving plates 74 and 75 and are secured to the movement guide plate 71.

The moving plates 74 and 75 are plates provided in vertical direction and while using respectively the vertical two guide rails 76 and 77, move on the rails in right and left direction on the drawing. These moving plates are respectively coupled to the guide rails 76 and 77 through a plurality of bearings 78 and 79. The upper portions of the moving plates 74 and 75 are bent by 90? in horizontal direction, in that perpendicular direction in the sheet of the drawing, and on these bent potions 74a and 75a the spindles are carried and respectively secured thereto.

A nut portion 72a of the moving part in the ball screw mechanism 72 is secured to the back side of the moving plate 74 and a screw portion 72b thereof is coupled to a motor 72c secured at the side of the movement guide plate 71. Thereby, the screw portion 72b is driven by the motor 72c.

A nut portion 73a of the moving part in the ball screw mechanism 73 is secured to the back side of the moving plate 75 and a screw portion 73b thereof is coupled to a motor 73c secured at the side of the movement guide plate 71. Thereby, the screw portion 73b is driven by the motor 73c.

The motors 72c and 73c are respectively controlled by the drive control unit 70 and thereby, the spindles 5 and 6 are linearly moved along the movement guide plate 71. FIGS. 3 (a), (b) show the movement control states. Further, the spindles 5 and 6 are driven to rotate by the drive control unit 70.

In FIG. 3 (a), the spindle 6 locates at own initial position corresponding to the spindle 6 (point P5) and the spindle 5 is shifted leftward while spacing a predetermined interval with respect to the spindle 6. This state is a first state where the spindle 5 is positioned at a spindle inspection position on the dashed line O2 where the disk fitted thereto is positioned at the inspection position of the surface inspection optical system 4.

In FIG. 3 (b), the spindle 5 locates at own initial position corresponding to the spindle 5 (point P2) and the spindle 6 is shifted rightward while spacing a predetermined interval with respect to the spindle 5. This state is a second state where the spindle 6 is positioned at a spindle inspection position on the dashed line O2 where the disk fitted thereto is positioned at the inspection position of the surface inspection optical system 4. Herein the drive control unit 70 switches between these two states in response to the spindle switching process by the control device 11.

The drive control unit 70 causes the switching movement of the respective spindles 5 and 6 from the first state to the second state and vice versa in response to an inspection completion signal E of a disk 9 generated from the control device 11 which receives a defect detection signal from the surface inspection optical system 4, and positions the same alternatively to the respective spindle inspection positions. Herein, the states as shown in FIG. 3 (*a*), (*b*) are selectively provided through simultaneous movement of the spindles 5 and 6.

Further, since the inspection position of the surface inspection optical system 4 is somewhat shifted toward the spindle 6, a moving distance of the spindle 5 is herein a little longer than that of the spindle 6. When the inspection position of the surface inspection optical system 4 is provided at the center of the spindles 5 and 6, these moving distances become equal.

Further, the spindle 5 or 6 which is positioned at the inspection position of the surface inspection optical system 4 is driven to rotate by the drive control unit 70, and thereby the disk 9 is positioned at the inspection position under the surface inspection optical system 4 and is rotated to place the disk 9 in the inspection state. Further, the advancing and retreating drive of the loader handling robot 2 and the unloader handling robot 3 is also performed by the drive control unit 70 (see FIG. 2).

Figure 4:
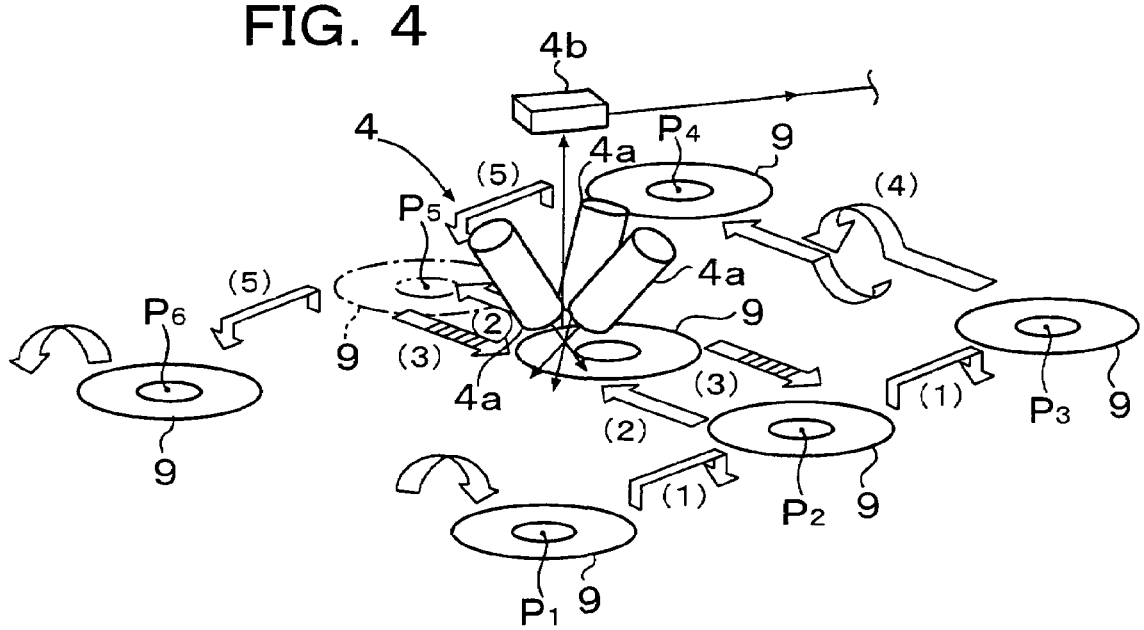
FIG. 4 is a view for explaining a flow of inverting and transferring operation in the present embodiment.

Through the above referred to movement of the spindles 5 and 6 and the advancing and retreating movement of the loader handling robot 2 and the unloader handling robot 3, the transfer of the disk 9 to the inspection position and the return there from, and the transfer of the disk by the disk inverting mechanism 8 are performed substantially on the disk transfer face S as shown in FIG. 4.

Now, the above operation will be explained. In FIG. 4, the loader handling robot 2 receives a new disk 9 at the disk supply position in the advancing position. The disk 9 at the disk supply position is fitted to the spindle 5 through retreating of the loader handling robot 2 (step (1)). A disk 9 having been fitted to the spindle 5 and already completed of the surface defect inspection is delivered to the disk inverting mechanism 8 at this retreating timing or another timing through the retreating of the loader handling robot 2 (step (1)).

The disk 9 fitted to the spindle 5 is set at the inspection position of the spindle 5 through the linear movement mechanism 7 by the switching drive of the spindle (step (2)). At this moment, the spindles 5 and 6 assume the first state as shown in FIG. 3 (*a*). The disk 9 fitted to the spindle 5 is transferred to the inspection position of the disk under the surface inspection optical system 4, at the same time, the spindle 6 attached a disk of which back face inspection has been completed, is retreated from the surface inspection optical system 4 and returns from the inspection position of the spindle 6 to the initial position (point P5).

Further, the movement through the switching drive of the spindle (step (2)) setting the spindles 5 and 6 at the first state as shown in FIG. 3 (*a*) occurs at a timing after the inspection of the disk 9 fitted to the spindle 6 has been completed. In this state, the spindle is rotated and the surface defect inspection of the disk 9 fitted to the spindle 5 begins.

After having been completed the surface inspection of the disk 9 fitted to the spindle 5, by means of the movement through the switching drive of the spindle (step (2)) which sets the spindle at its inspection position by the linear movement mechanism 7, the spindles 5 and 6 assume the second state as shown in FIG. 3 (*b*). At this moment, the spindle 5 retreats from the surface inspection optical system 4 and returns from the inspection position of the spindle 5 to the initial position (point P2). At this time, the disk 9 fitted to the spindle 6 for inspecting the back face side of the disk is transferred to the surface inspection optical system 4.

On the other hand, the disk 9 received by the disk inverting mechanism 8 is inverted through the transfer by the disk inverting mechanism 8 during disk inspection and is transferred to the delivery position of the disk for the back face side inspection. The disk inspection time is longer than that required for the disk inversion and transfer. Moreover, since the time required for inspecting two sheets of disks can be used in this instance, the disk 9 inverted by the disk inverting mechanism 8 arrives to the position P4 at the side of the spindle 6, before the surface inspection of the disk 9 fitted to the spindle 6 has been completed, and further, the disk inverting mechanism 8 can return to the original initial position P3 during the inspection of the disk 9 fitted to the spindle 6.

At first, the unloader handling robot 3 receives an inverted disk 9 at the retreated position from the disk inverting mechanism 8. When the surface inspection of the disk 9 fitted to the spindle 6 has been completed, through advancement of the unloader handling robot 3 (step (5)), the already inspected disk 9 fitted to the spindle 6 at the initial position (point P5) is transferred to the point P6 representing the disk discharge position. On the other hand, the inverted disk 9 is fitted to the spindle 6 at the initial position (point P5) through the advancement of the unloader handling robot 3 (step (5)) at the same time of this advancement or another timing.

In the above instance, the advance and retreat operation of the loader handling robot 2 in the step (1) includes an operation of moving up and down by a predetermined amount for delivering the disks as shown in the drawing. This operation is completed during the surface inspection of the inverted disk 9 fitted to the spindle 6 or before finishing the inspection. Further, the advance and retreat operation of the unloader handling robot 3 in the step (5) also includes an operation of moving up and down by a predetermined amount. This operation is also completed during the surface inspection of the disk 9 before being inverted and fitted to the spindle 5 or before finishing the inspection. The transfer operation of the disk 9 by the disk inverting mechanism 8 in the step (4) including reciprocating movement thereof is completed during the surface inspection of the front side or the back side of the disk 9.

Further, in the surface inspection optical system 4 as shown in FIG. 4, 4*a* is a laser projection light optical system and 4*b* is a light receiving element (APD). In response to scattering light received by the light receiving element 4*b*, an electrical signal relating to a detected defect is sent to the control device 11 via such as a D/A converting circuit. An illustration of a light receiving optical system to be placed in front of the light receiving element 4*b* is omitted.

Herein below the entire disk transfer operation by the disk transfer mechanism 10 will be explained according to FIGS. 5 through 7. Further, the processing as shown in FIG. 7 is performed by the control device 11 through control of the drive control unit 70.

Figure 7:
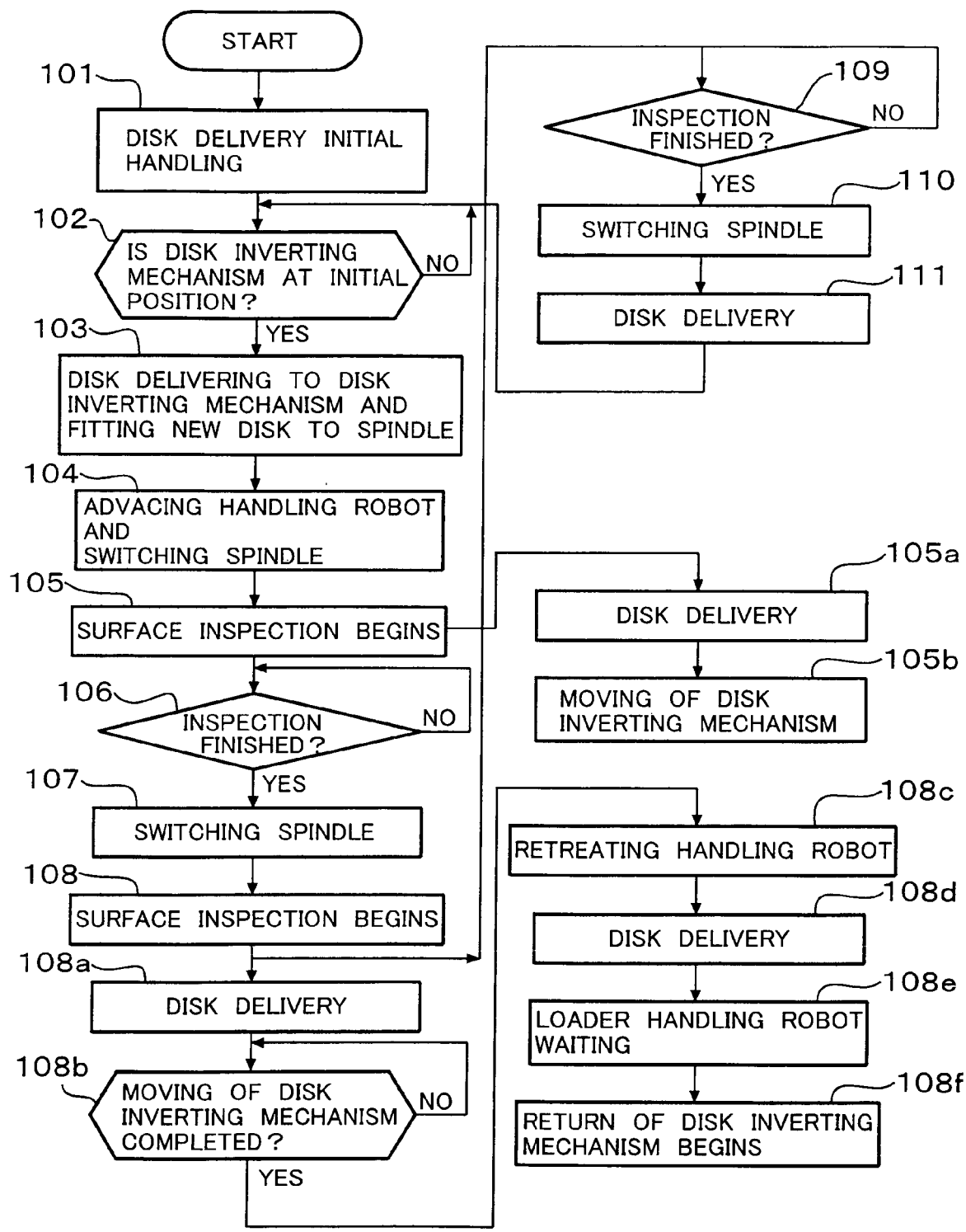
FIG. 7 is a flow chart of disk handling process.

At the initial handling processing of disk delivery in step 101 in FIG. 7, after independent or simultaneous back and forth movement of the respective loader handling robot 2 and unloader handling robot 3 and followed by the delivery of disks 9 through the above referred to outer circumference/inner circumference chuck, the loader handling robot 2 and unloader handling robot 3 are retreated, and it is assumed that the respective disks 9 in the disk transfer mechanism 10 are in a state as shown in FIG. 5 (*a*).

This state represents a state during the control by the control device 11 after a disk 6 fitted to the spindle 6 has been discharged at the disk discharge position P6 via the disk changer 3a, the loader handling robot 2 receives a new disk 9c on the disk changer 2a at the disk supply position P1 and the loader handling robot 2 and the unloader handling robot 3 are retreated.

Figure 5A:
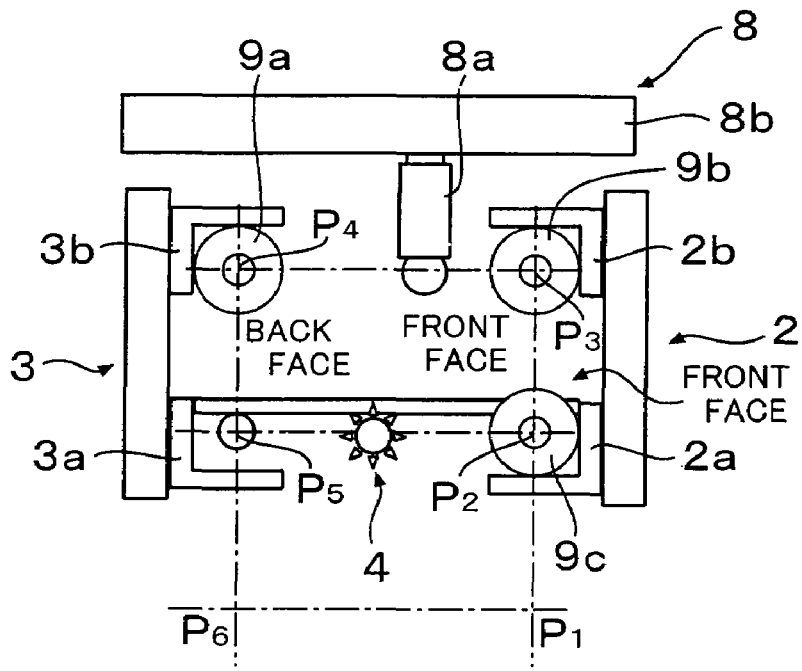
FIG. 5 is a view for explaining a disk handling operation at an initial condition.
Figure 5B:
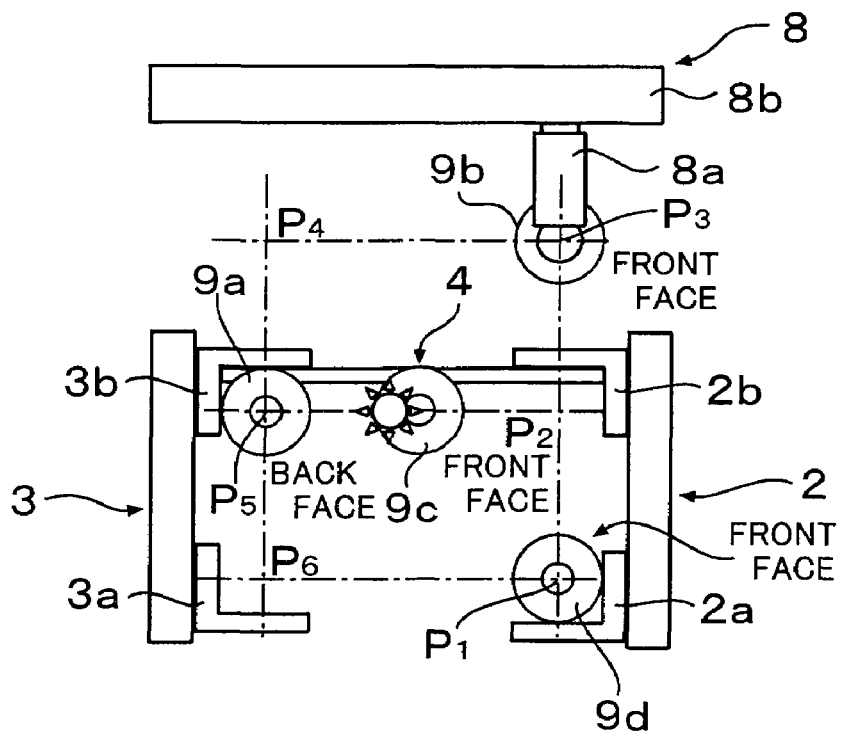
Figure 6A:
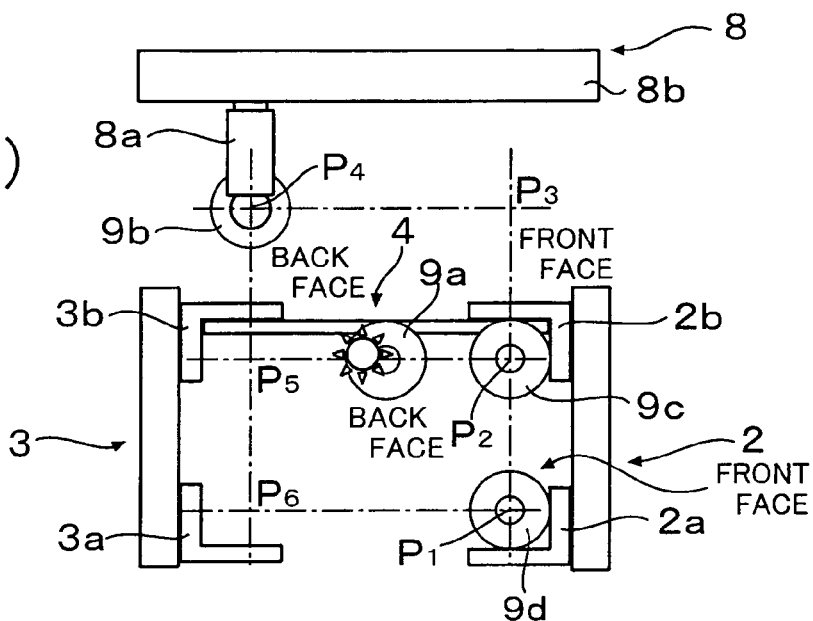
FIG. 6 is a view for explaining a disk transferring operation at respective stages in the transfer mechanism.
Figure 6B:
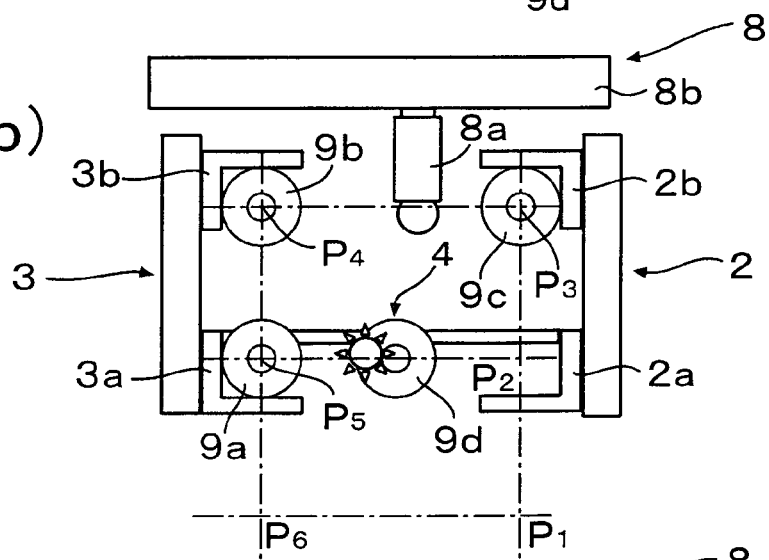
Figure 6C:
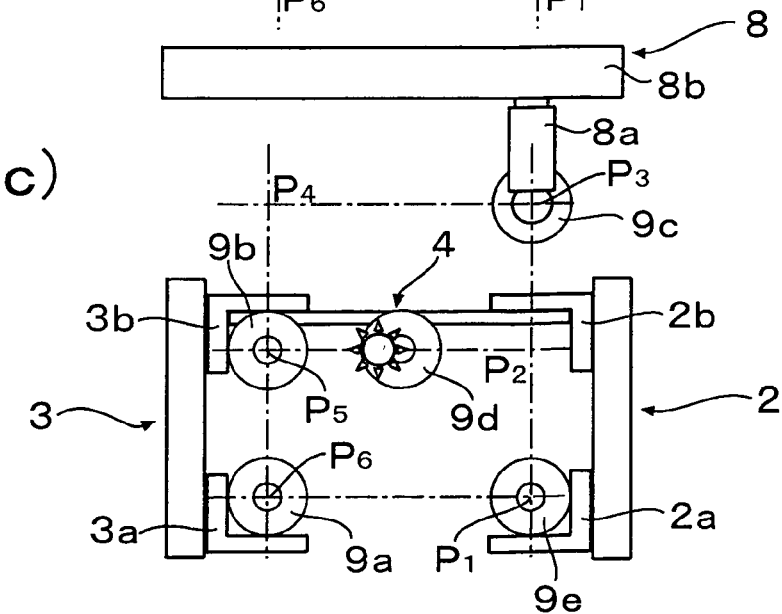

Further, in FIGS. 5 and 6, the letter "front face" added near the disk indicates that the front face side thereof is upward and the letter back face added near the disk indicates that the back face side thereof is upward.

Since the state as shown in FIG. 5(a) represents a state after the disk changer 2b has received an already inspected disk 9a from the spindle 5 the loader handling robot 2 is retreated, the already inspected disk 9b is in a condition to permit delivery to the disk inverting mechanism 8. On the other hand, the disk inverting mechanism 8 is in a state after delivered the already inverted disk 9a to the disk changer 3a of the retreated unloader handling robot 3. Since the disk changer 2b of the loader handling robot 2 is in the retreated state, the disk inverting mechanism 8 returns to the initial position P3 for receiving the already inspected disk 9b. Wherein since the disk inverting mechanism 8 is in a way of moving rightward in the drawing toward the initial position P3 and has not yet returned to the initial position P3, the loader handling robot 2 is in a position moved upward by the predetermined amount so as not disturb the movement of the disk inverting mechanism 8.

In the initial handling state as shown in FIG. 5(a) the spindle 6 has not been moved under the surface inspection optical system 4. Although the disk changer 2a of the loader handling robot 2 is retreated, the loader handling robot 2 has not been moved down by the predetermined amount. Therefore, the new disk 9c on the disk changer 2a is in a condition to be fitted to the spindle 5. At this moment, the disk changer 3a of the unloader handling robot 3 carries no disk and the disk changer 3b of the unloader handling robot 3 has received the already inverted disk 9a from the disk inverting mechanism 8. This state corresponds to a state at a time of waiting processing of the handling robot in step 108e, which will be explained later.

Figure 3A:
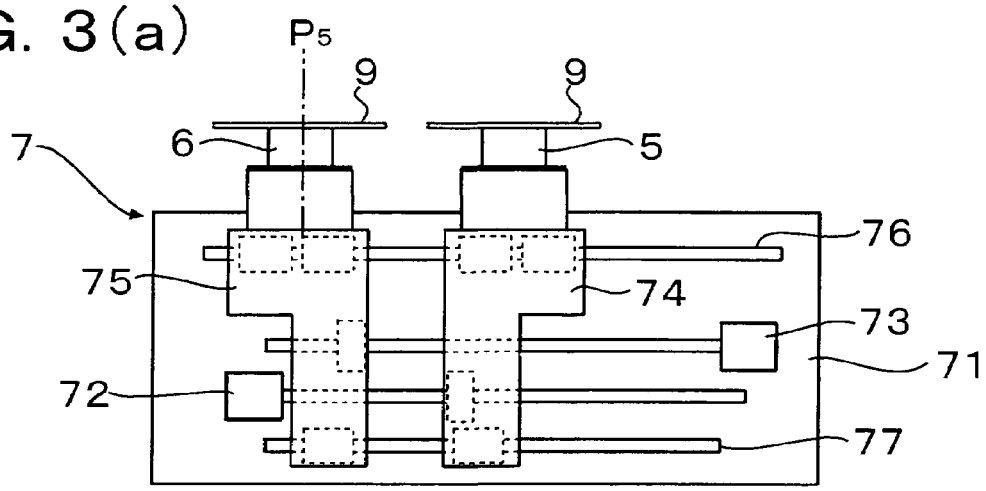
FIG. 3 is a view for explaining a switching and movement operation of two spindles.

Subsequently, the control device 11 judges whether the disk inverting mechanism 8 has returned to the initial position (step 102), and when the return to the initial position of the disk inverting mechanism 8 is judged, the delivery of the already inspected disk 9b to the disk inverting mechanism 8 and the fitting of the new disk 9c to the spindle 5 are performed at the same time by the loader handling robot 2 only for the first time processing (step 103). Then, the control device 11 advances the respective handling robots as well as performs the spindle switching processing which sets the respective spindles to the inspection position (step 104). Thus the loader handling robot 2 is advanced and the state as shown in FIG. 5(b) is given. By the processing in step 104, the spindles 5 and 6 are set in the first state as shown in FIG. 3(a) through the drive by the drive control unit 70. Then, the surface inspection of the disk 9c fitted to the spindle 5 begins (step 105). At this instance, during the inspection of the disk 9c the control device 11 performs at the same time and in parallel the disk delivery processing (step 105a) and the movement of the disk inverting mechanism 8 as the task processing. Then the process moves to a judgment whether the inspection has finished and enters into an inspection finish waiting loop (step 106).

In the disk delivery processing in step 105a, the disk changer 2a of the loader handling robot 2 which is advanced at the inspection beginning timing receives a new disk 9d at point P1 (see FIG. 5(b)). The disk changer 3b carrying the already inverted disk 9a on the unloader handling robot 3 which is advanced at the same time, delivers the same to the spindle 6 at the point P5. Thereby, the disk 9a is fitted to the spindle 6 (see FIG. 5(b)).

In the above explained disk transfer, during movement of the disk inverting mechanism 8 in step 105b, since both of the loader handling robot 2 and the unloader handling robot 3 are advanced, enough space for moving the disk inverting mechanism 8 and for inverting a disk 9 is ensured (see FIG. 5(b)). At this moment the surface of the disk 9c fitted to the spindle 5 is under inspection. During this inspection, the movement and the inversion of the disk 9b is performed.

When the judgment in the inspection finish waiting step 106 turns to YES and the inspection for the disk 9c fitted to the spindle 5 has been finished, the spindle switching processing for setting the same to the inspection position is performed (step 107).

Figure 3B:
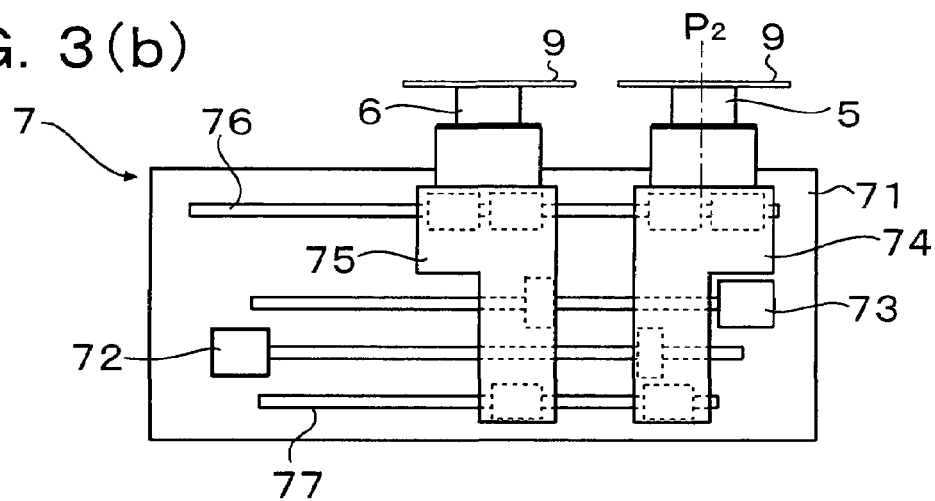

Accordingly, the spindles 5 and 6 are set to the second state (FIG. 3(b)). Namely, the control device 11 returns the spindle 5 to the own initial position P2 by the linear movement mechanism 7 and at the same time transfers the disk 9a fitted to the spindle 6 to the inspection position under the surface inspection optical system 4. Then the inspection of the disk 9a begins (step 108).

When the inspection begins, at the same time during the inspection of the disk 9a, the control device 11 successively performs the following steps in parallel as the task processing, in that a disk delivery processing (step 108a), a judgment processing whether the movement of the disk inverting mechanism 8 has been completed (step 108b), thereafter a retreat processing of the handling robots (step 108c), another disk delivery processing (108d), a waiting processing of the loader handling robot (108e) and then a beginning of return of the disk inverting mechanism 8 (108f).

At the disk delivery processing in step 108a, the already inspected disk 9a fitted to the spindle 5 is delivered to the disk changer 2b of the advanced loader handling robot 2. Further, the disk changer 3a of the unloader handling robot 3 which is advanced during the inspection of the disk 9a, discharges an already inspected disk 9, however, the drawing illustrates the operation from the initial state, no disk on the disk changer 3a is illustrated. FIG. 6(a) shows the above explained state.

Then, at the timing when the movement of the disk inverting mechanism 8 has been completed (see FIG. 6(a)), the control device 11, after obtaining YES judgment in step 108b, causes to retreat both of the loader handling robot 2 and the unloader handling robot 3 in step 108c and causes to enter into step 108d.

At the disk delivery processing in step 108d, the control device 11 causes to receive the disk 9a inverted by the disk inverting mechanism 8 by the disk changer 3b of the retreated unloader handling robot 3. The disk 9d (a new disk of inspection object) carried by the disk changer 2a of the retreated loader handling robot 2 is fitted to the spindle 5. Then the control device 11 causes to move upward the loader handling robot 2 by the predetermined amount as the loader handling robot waiting processing (step 108e) and causes to enter into the waiting state for delivering the disk 9c carried by the disk changer 2b to the disk inverting mechanism 8.

In step 108f, the disk inverting mechanism 8 begins the operation for returning to the initial position (P3). Thereafter, the disk inverting mechanism 8 assumes the state as shown in FIG. 5(a), however, at this moment since the disk 9a fitted to the spindle 6 as shown in FIG. 6(a) is under inspection of which condition is different from the initial state as shown in FIG. 5(a).

Separate from the processing in steps 108a~108e during disk inspection, after step 108 enters into judgment whether the inspection has finished and circulates the inspection finish waiting loop (step 109).

When the judgment in step 109 turns to YES, since the inspection of the disk 9a fitted to the spindle 6 is finished, the control device 11 performs the spindle switching and transfer processing for setting the same to the inspection position (step 110). Thereby, the respective spindles are set at the first state (FIG. 3 (a)). In this instance, the control device 11 sets the disk 9d fitted to the spindle 5 to the inspection position by the linear movement mechanism 7. At the same time the control device 11 returns the disk 9a fitted to the spindle 6 to the own initial position P5.

Further, with regard to a disk carried by the disk charger 3a of the retreated unloader handling robot 3, although no disk is carried in the initial state referred to above, in contrast, even if the disk charger 3a carries a disk, which is already discharged, therefore, the disk charger 3a carries no disk. Therefore, the disk charger 3a can be returned to a state ready for receiving the disk 9a fitted to the spindle 6. Further, if the outer circumferential chuck of the disk changer 3a disturbs when the spindle 6 returns to the initial position P5, the unloader handling robot 3 is moved upward by the predetermined amount to place the same in the waiting position like the loader handling robot 2.

When the disk 9a returns to the own initial position P5, in the subsequent step 111 of disk delivery processing, the control device 11 causes the disk changer 3a of the unloader handling robot 3 to receive the already inspected disk 9a fitted to the spindle 6 (step 111), of which state is shown in FIG. 6 (b).

Although FIG. 6 (b) corresponds to FIG. 5 (a), FIG. 6 (b) differs from FIG. 5 (a) in the following points, in that the disk 9a fitted to the spindle 6 as shown in FIG. 6 (a) is in the initial position P5 and in addition the disk 9d is under inspection.

In this instance, since the loader handling robot 2 is on the position moved upward by the predetermined amount, the process returns to the step 102 for judging whether the disk inverting mechanism 8 returns to the initial position. Then, in step 103 the disk 9c is delivered from the disk changer 2b to the disk inverting mechanism 8 as referred to above. In this step 103, different from the first step 103, the fitting of the disk 9d to the spindle 5 is already finished, no disk is carried by the disk changer 2a as shown in FIG. 6 (b). Therefore, in this instance, the simultaneous fitting of a disk to the spindle 5 is not effected.

On the other hand, the disk changer 3a of the unloader handling robot 3 carries the already inspected disk 9a. Further, the disk changer 3b carries the inverted disk 9b before inspection. Therefore, the control device 11 causes to advance both of the loader handling robot 2 and the unloader handling robot 3 and to move downward by the predetermined amount to place the disk inverting mechanism 8 in the state as shown in FIG. 6 (c). In this instance, the disk 9b carried by the disk changer 3b is fitted to the spindle 6 at the initial position P5 and the disk 9a is delivered to the handling robot of the cassette side at the disk discharge position (unloader position) P6. Prior to this processing the disk changer 2a of the loader handling robot 2 receives a new disk 9e from the handling robot of the cassette side. Thus, the state as shown in FIG. 5 (b) is given. Then, the judgment in the inspection finish waiting step 106 turns to YES, the state as shown in FIG. 6 (a) is given and the like processing returning from the step 111 to the step 102 is repeated until the inspection finishes.

Further, since the finishing of the inspection processing in the disk inspection apparatus is determined at the timing when the last disk is discharged, in FIG. 7 flowchart the finishing processing is not included. The finishing processing is a judgment between the step 102 in which whether the disk inverting mechanism 8 returns to the initial position is judged and the step 103 and both of the loader handling robot 2 and the unloader handling robot 3 are set at the retreated position.

Now, in the step 103 at the first time, the control device 11 performs the delivery of the already inspected disk 9b to the disk inverting mechanism 8 and the fitting of the new disk 9c to the spindle 5 at the same time. However, in the step 103 after the second time, since the fitting of the disk 9d of new inspection object to the spindle 5 is already performed in the step 108d, after performing the waiting processing of the loader handling robot 2 in the step 108e and when the disk inverting mechanism 8 returns to the initial position P3, the already inspected disk 9b is delivered to the disk inverting mechanism 8. Thereby, the handling processing for setting disks to the inspection position can be shortened.

Figure 8:
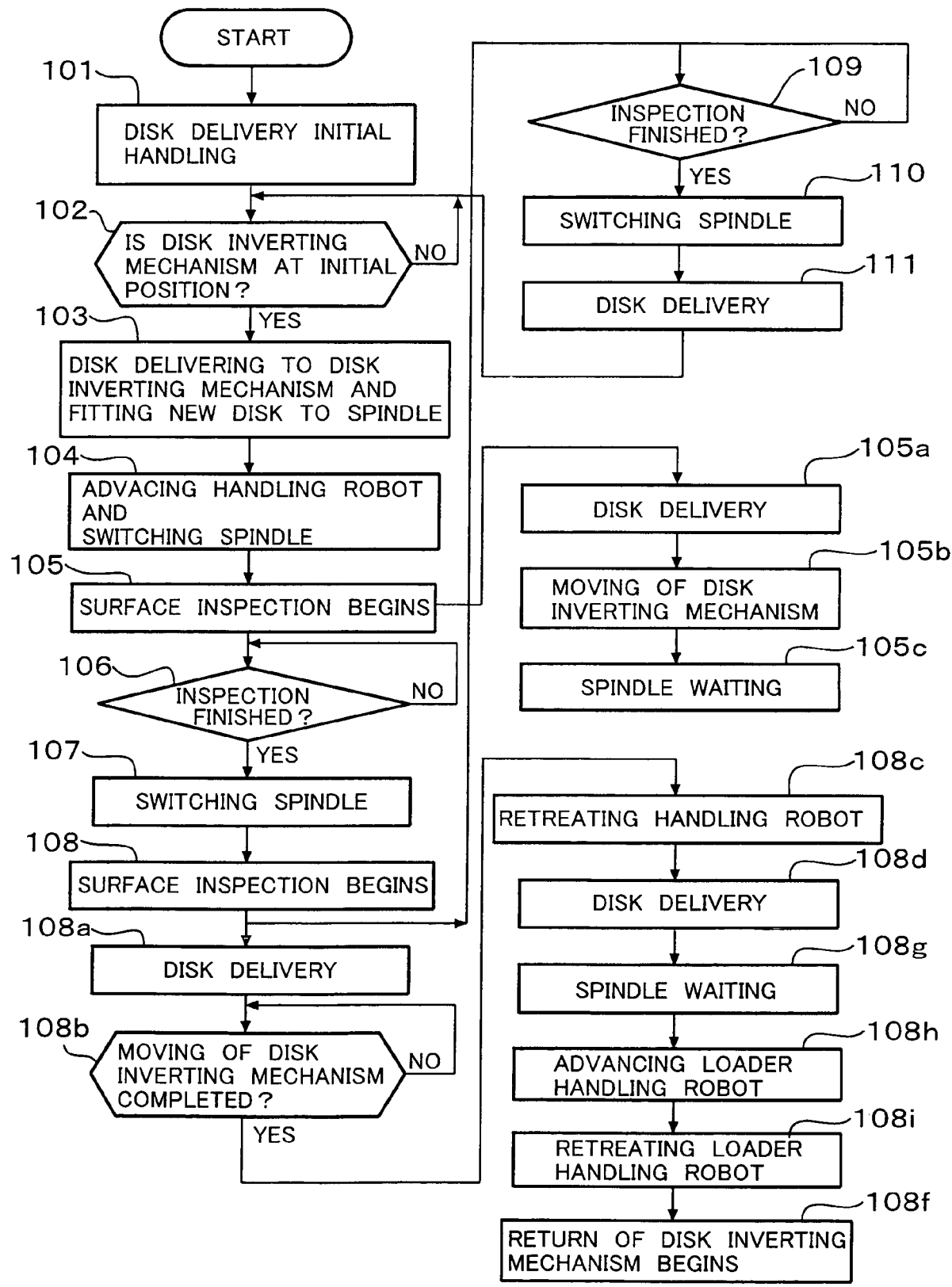
FIG. 8 is a flow chart of disk handling process in which spindles are waited before respective inspection positions.

FIG. 8 shows a disk delivery processing by the disk transfer mechanism 10, which further enhances the throughput thereof.

Points different from the processing as explained in connection with FIG. 7 are provisions of a spindle waiting processing (step 105c) in which after the step 105b the spindle 6 at the side of disk back face inspection is waited before its inspection position and another spindle waiting processing (step 108g) in which after the step 108d the spindle 5 at the side of disk front face inspection is waited before its inspection position. Further, in place of the handling robot waiting processing in the step 108e, a waiting processing through advancing (step 108h) of the loader handling robot 2 and a disk delivery processing to the disk inverting mechanism 8 by retreating thereof (step 108i) are added.

Figure 9A:
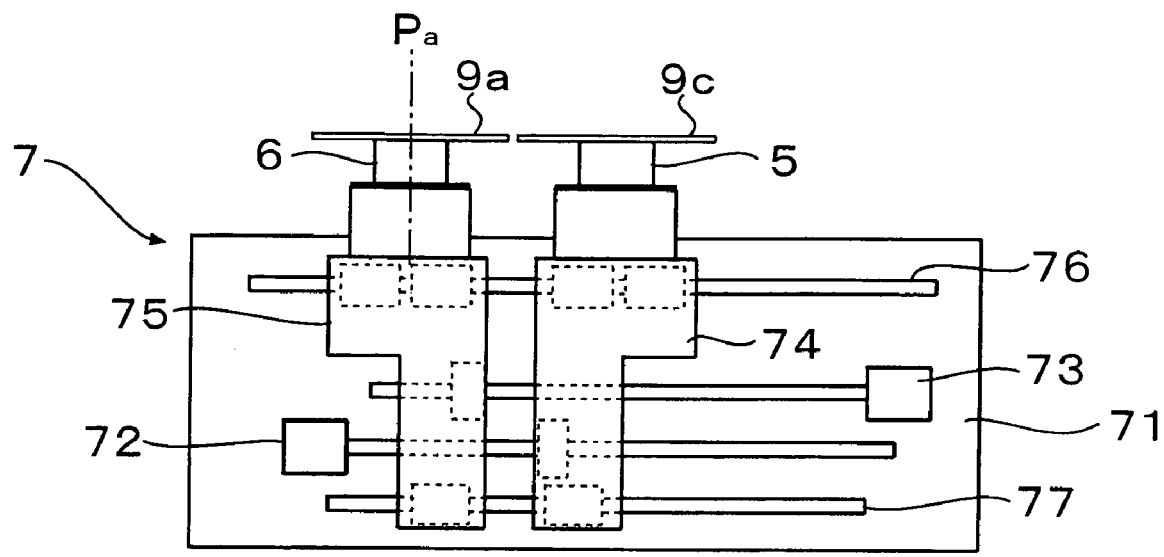
FIG. 9 is a view for explaining waiting positions for spindles in a linear movement mechanism.
Figure 9B:
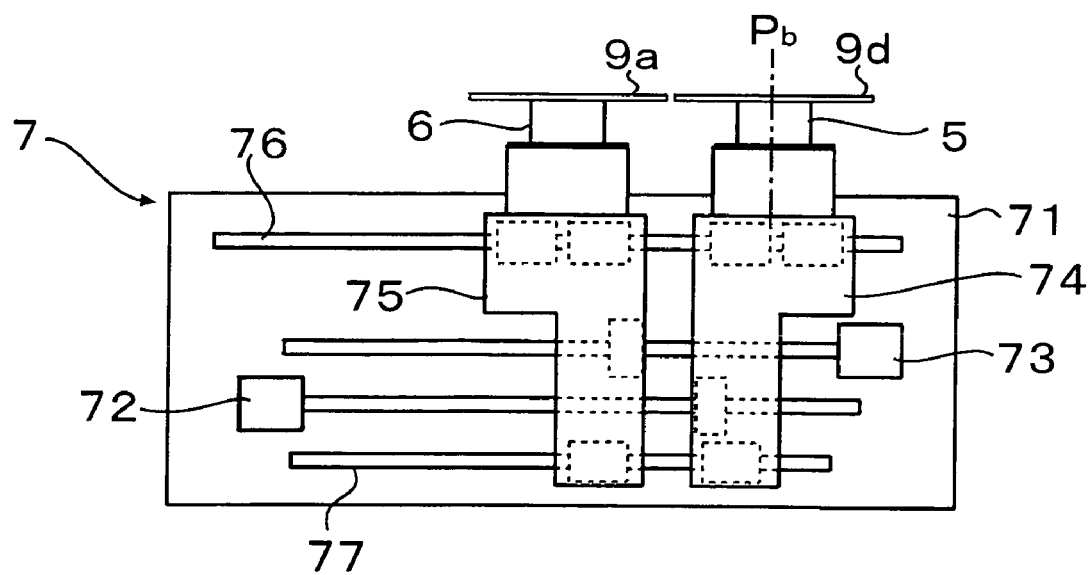

In the spindle waiting processing in the step 105c, during the inspection of the disk 9c fitted to the spindle 5 as shown in FIG. 9 (a), the disk 9a fitted to the spindle 6 is moved so that the disk 9a fitted to the spindle 6 is placed close to the disk 9c fitted to the spindle 5 under inspection and waited before the inspection position of the spindle 6. Namely, the control device 11 drives the drive control unit 70 so that the spindle 6 moves to a waiting position Pa where the disk 9a does not contact the disk 9c under inspection. Then at the time when the inspection of the disk 9c has finished, the spindle switching to the second state as shown in FIG. 3 (b) is performed. Thereby, the moving time of the spindle 6 to the inspection position is shortened than the moving time from the initial position P5 to the inspection position.

In the spindle waiting processing in the step 108g, during the inspection of the disk 9a fitted to the spindle 6 as shown in FIG. 9 (b), the disk 9d fitted to the spindle 5 is moved close to the disk 9a fitted to the spindle 6 and waited before the inspection position of the spindle 5. Namely, the control device 11 drives the drive control unit 70 so that the spindle 5 moves to a waiting position Pb where the disk 9d does not contact the disk 9a under inspection. Then at the time when the inspection of the disk 9a has finished, the spindle switching to the first state as shown in FIG. 3 (a) is performed. Thereby, the moving time of the spindle 5 to the inspection position is shortened than the moving time from the initial position P2 to the inspection position.

Through these waiting processing of the respective spindles, the respective spindles can be set in a short time to the respective inspection positions and the throughput of the inspection processing can be enhanced.

On the other hand, the advancing (step 108h) of the loader handling robot 2 is performed after the disk delivery processing in the step 108d and is for setting the disk changer 2b outside the moving passage of the disk inverting mechanism 8.

Thereby, a collision between the disk inverting mechanism 8 and the disk changer 2b is avoided. Further, a delivery of a disk carried by the disk changer 2b to the disk inverting mechanism 8 can be performed through the retreating processing of the loader handling robot 2. As a result, the waiting processing of the loader handling robot 2 in the step 108e is unnecessitated.

Now, in the present embodiment, the chuck mechanisms in the disk changers 2a, 2b, 3a and 3b respectively chuck the outer circumference of a disk 9 at three points and the disk inverting chuck mechanism 8a and the chuck mechanism in the spindles 5 and 6 respectively chuck the inner circumference of a disk. In such case, since the chuck positions of a disk by the outer circumferential chuck and the inner circumferential chuck do not overlap each other, the chucking operation by the respective chuck mechanisms can be performed either from upward or from downward. Further, the outer circumferential chuck can be performed on the same plane as the disk to be chucked.

However, when such as arms for supporting a disk chuck disturbs, since the chucks of the spindles 5 and 6 chuck a disk from bottom side, it is preferable that the chuck mechanisms of the disk changers 2a, 2b, 3a and 3b chuck from the same plane as a disk or from upper side of a disk. The disk inverting chuck mechanism 8a is preferable to chuck a disk from bottom side like the chucks of the spindles 5 and 6.

Of course, when the chuck positions do not overlap, the chuck mechanism for the disk changers 2a, 2b, 3a and 3b and the disk inverting chuck mechanism 8a can be modified to such a disk chuck mechanism in which a disk is chucked on the inner circumference at one point and on the outer circumference at two points. Such a chuck mechanism is disclosed in U.S. Pat. No. 5,999,366 as referred to above.

Further, since the disk changers 2a, 2b, 3a and 3b chucking a disk outer circumferentially is only required to hold a disk and transfer the same in back and forth direction, the disk changers 2a, 2b, 3a and 3b are not necessarily required to have a chuck mechanism. Therefore, in place of the chuck mechanism, these can be outer circumference supporting mechanisms such as pins, which receive outer circumference of a disk at three points. In this instance, it is preferable to form the disk supporting pin into a supporting mechanism such as a receptacle in which a step directing inward is provided at the top end thereof so that the outer circumference of a disk couples with the step to hold the same.

Although the present invention has been explained hitherto, the program processing as shown in FIG. 6 is only an example, the disk delivery processing by the loader handling robot 2 and the unloader handling robot 3 can be performed in spare time during inspection of any one of the disks.

In the present embodiment, since the disk inspection position on the inspection stage is shifted leftward in the drawing, the respective spindle inspection positions to which the respective spindles 5 and 6 are set are different respectively, it is of course acceptable to select the disk inspection position on the inspection stage so that the inspection positions of the spindles 5 and 6 assume the same position.

Further, in the embodiment the advancing distance and the retreating distance of the loader handling robot 2 and the unloader handling robot 3 can be set different. In such instance, the positional relationship between the loader handling robot 2, the unloader handling robot 3 and the disk inverting mechanism 8 differs respectively.

Further, in the embodiment, although the inspection stage provided between the spindles 5 and 6 is the surface inspection optical system 4, other inspection stages for inspecting front and back faces, for example, a stage for inspecting electrical characteristics can be of course disposed in the place of the surface inspection optical system 4.

Still further, in the present embodiment, the explanation is primarily directed to magnetic disks, the present invention is of course applicable to an inspection of front and back faces of disks other than magnetic disks including substrates of magnetic disks.

The invention claimed is:

1. A disk transfer mechanism for a disk inspection apparatus successively inspecting front and back faces of a disk including a disk inverting mechanism for inverting the front and back faces of the disk comprising:
   a first spindle and a second spindle which are set at first initial position and at a second initial position respectively which are on a straight alignment line on which the first initial position, inspection positions for disk inspection at which the spindles are set and the second initial position are aligned, and which are positioned alternatively at the respective inspection positions,
   a spindle moving mechanism which moves the first spindle and the second spindle respectively along the alignment line toward the respective inspection positions, and
   a control unit through control of the spindle moving mechanism which moves the first spindle to the inspection position, after completing an inspection of a disk fitted to the first spindle, moves the first spindle from the own inspection position to the first initial position as well as moves the second spindle to the own inspection position, and after completing an inspection of a disk fitted to the second spindle, moves the second spindle from the own inspection position to the second initial position as well as moves the first spindle to the own inspection position,
   wherein the disk fitted to the second spindle is the one that is detached from the first spindle after completing the inspection and inverted by the disk inverting mechanism.

2. A disk transfer mechanism according to claim 1, wherein the disk inverting mechanism is provided at a front or back position on a line perpendicular to the alignment line and moves from a starting position corresponding to the first initial position to an end position corresponding to the second position along the direction of the alignment line, the disk inverting mechanism receives at the starting position an already inspected disk fitted to the first spindle at the first initial position, inverts the same and transfers the inverted disk to the end position, and the second spindle receives at the second initial position the inverted disk at the end position.

3. A disk transfer mechanism according to claim 2, further comprising a surface defect inspection optical system for optically inspecting the surface defect of the disk when the first spindle or the second spindle is positioned at the respective own inspection positions, and the disk fitted to the first spindle is a magnetic disk.

4. A disk transfer mechanism according to claim 3, further comprising a first and second disk handling arm, wherein the first handling arm detaches at the first initial position the already inspected disk fitted to the first spindle and delivers the same to the disk inverting mechanism at the starting position, and the second handling arm receives the inverted disk from the disk inverting mechanism at the end position and fits the same to the second spindle at the second initial position.

5. A disk transfer mechanism according to claim 4, wherein an inversion of a first disk by the disk inverting mechanism is performed during inspection of a disk fitted to the second spindle or a disk fitted to the first spindle.

6. A disk transfer mechanism according to claim 5, wherein when moving the first spindle to the own inspection position, the control unit moves the same from the first initial position and when moving the second spindle to the own inspection position, the control unit moves the same from the second initial position.

7. A disk transfer mechanism according to claim 5, wherein when the disk fitted to the first spindle is under inspection, the control unit moves the second spindle from the second initial position to a first waiting position adjacent to the disk fitted to the first spindle under inspection and when the inspection of the disk fitted to the first spindle has finished, the control unit moves the second spindle from the first waiting position to the own inspection position, and when the disk fitted to the second spindle is under inspection, the control unit moves the first spindle from the first initial position to a second waiting position adjacent to the disk fitted to the second spindle under inspection and when the inspection of the disk fitted to the second spindle has finished, the control unit moves the first spindle from the second waiting position to the own inspection position.

8. A disk transfer mechanism according to claim 5, further comprising a third and fourth arm, wherein the third arm transfers a disk of inspection object delivered at a disk supply position from the disk supply position to the first initial position and fits the same to the first spindle at the first initial position, and the fourth disk handling arm detaches an already inspected disk fitted to the second spindle at the second initial position from the second spindle and transfers the same to a disk discharge position.

9. A disk transfer mechanism according to claim 8, further comprising a first handling robot and a second handling robot, wherein the first handling robot is provided with the first disk handling arm and the third disk handling arm, the second handling robot is provided with the second disk handling arm and the fourth disk handling arm, and a disk delivery face between the first handling robot, the first spindle and the disk inverting mechanism and a disk delivery face between the second handling robot, the second spindle and the disk inverting mechanism are substantially on a same plane.

10. A disk transfer mechanism according to claim 9, wherein a distance between the first initial position and the disk supply position is substantially equal to a distance between the first initial position and the starting position, and a distance between the second initial position and the disk discharge position is substantially equal to a distance between the second initial position and the end position.

11. A disk transfer mechanism according to claim 1, further comprising a surface defect inspection optical system for optically inspecting the surface defect of the disk when the first spindle or the second spindle is positioned at the respective own inspection positions, and the disk fitted to the first spindle is a magnetic disk.

12. A disk inspection apparatus successively inspecting front and back faces of a disk including a disk inverting mechanism for inverting the front and back faces of the disk comprising:

a first spindle and a second spindle which are set at first initial position and at a second initial position respectively which are on a straight alignment line on which the first initial position, inspection positions for disk inspection at which the spindles are set and the second initial position are aligned, and which are positioned alternatively at the respective inspection positions, a spindle moving mechanism which moves the first spindle and the second spindle respectively along the alignment line toward the respective inspection positions, and a control unit through control of the spindle moving mechanism which moves the first spindle to the inspection position, after completing an inspection of a disk fitted to the first spindle, moves the first spindle from the own inspection position to the first initial position as well as moves the second spindle to the own inspection position, and after completing an inspection of a disk fitted to the second spindle, moves the second spindle from the own inspection position to the second initial position as well as moves the first spindle to the own inspection position, wherein the disk fitted to the second spindle is the one that is detached from the first spindle after completing the inspection and inverted by the disk inverting mechanism.

13. A disk inspection apparatus according to claim 12, wherein the disk inverting mechanism is provided at a front or back position on a line perpendicular to the alignment line and moves from a starting position corresponding to the first initial position to an end position corresponding to the second position along the direction of the alignment line, the disk inverting mechanism receives at the starting position an already inspected disk fitted to the first spindle at the first initial position, inverts the same and transfers the inverted disk to the end position, and the second spindle receives at the second initial position the inverted disk at the end position.

14. A disk inspection apparatus according to claim 13, further comprising a surface defect inspection optical system for optically inspecting the surface defect of the disk when the first spindle or the second spindle is positioned at the respective own inspection positions, and the disk fitted to the first spindle is a magnetic disk.

15. A disk inspection apparatus according to claim 14, further comprising a first and second disk handling arm, wherein the first handling arm detaches at the first initial position the already inspected disk fitted to the first spindle and delivers the same to the disk inverting mechanism at the starting position, and the second handling arm receives the inverted disk from the disk inverting mechanism at the end position and fits the same to the second spindle at the second initial position.

16. A disk inspection apparatus according to claim 12, further comprising a surface defect inspection optical system for optically inspecting the surface defect of the disk when the first spindle or the second spindle is positioned at the respective own inspection positions, and the disk fitted to the first spindle is a magnetic disk.

17. A disk inspection method for successively inspecting front and back faces of a disk which includes arranging a first spindle and a second spindle at first initial position and at a second initial position respectively which are on a straight alignment line on which the first initial position, inspection positions for disk inspection at which the spindles are set and the second initial position are aligned and are positioning the same alternatively at the respective inspection positions, and inspecting a disk fitted to the first spindle or a disk fitted to the second spindle under the condition fitted to the respective spindles comprising the steps of:

after completing an inspection of a disk fitted to the first spindle, moving the first spindle from own inspection position to the first initial position as well as moving the second spindle to own inspection position, after completing an inspection of a disk fitted to the second spindle, moving the second spindle from the own inspection position to the second initial position as well as moving the first spindle to the own inspection position, detaching an already inspected disk fitted to the second spindle from the second spindle and discharging the same, and inverting an already inspected disk fitted to the first spindle and fitting the same to the second spindle.

18. A disk inspection method according to claim 17, wherein a disk inverting mechanism is provided at a front position or a back position on a line perpendicular to the alignment line, the disk inverting mechanism is moved between a starting position corresponding to the first initial position and an end position corresponding to the second initial position, receives an already inspected disk fitted to the first spindle at the first initial position, inverts the same at the midway thereof, transfers the inverted disk to the end position, and the second spindle at the second initial position receives the inverted disk at the end position.

19. A disk inspection method according to claim 18, wherein when the first spindle or the second spindle is positioned at the respective own inspection positions, a disk fitted to the first spindle or the second spindle is inspected by a surface defect inspection optical system and the disk fitted to the first spindle is a magnetic disk.

* * * * *